United States Patent [19]

Weyer et al.

[11] Patent Number: 4,612,602
[45] Date of Patent: Sep. 16, 1986

[54] FRONT PLATE MOUNTING GROUP FOR A PRINTED CIRCUIT BOARD

[75] Inventors: Erhard Weyer, Düsseldorf; Werner Züchner, Weinheim-Lützelsachsen, both of Fed. Rep. of Germany

[73] Assignee: Mentor Ing. Dr. Paul Mozar, Fed. Rep. of Germany

[21] Appl. No.: 677,201

[22] Filed: Dec. 3, 1984

[30] Foreign Application Priority Data

Dec. 3, 1983 [DE] Fed. Rep. of Germany ....... 3343764
Jun. 14, 1984 [DE] Fed. Rep. of Germany ... 8417989[U]
Aug. 31, 1984 [DE] Fed. Rep. of Germany ... 3432048[U]

[51] Int. Cl.[4] .............................................. H05K 1/18
[52] U.S. Cl. ................................. 361/394; 339/17 C; 339/176 MP; 361/399; 361/413
[58] Field of Search ............... 361/394, 395, 399, 413, 361/417; 339/17 C, 17 R, 176 MP, 183, 186 M, 189 R

[56] References Cited

U.S. PATENT DOCUMENTS

| | | | |
|---|---|---|---|
| 3,963,301 | 6/1976 | Stark | 339/186 M |
| 4,039,902 | 8/1977 | Lacan et al. | 361/399 X |
| 4,186,988 | 2/1980 | Kobler | 339/17 C X |
| 4,296,454 | 10/1981 | Wong | 361/386 |
| 4,390,224 | 6/1983 | Showman et al. | 339/176 MP X |
| 4,405,189 | 9/1983 | Douty et al. | 339/17 C |
| 4,410,230 | 10/1983 | SanMiguel | 339/176 M |
| 4,423,466 | 12/1983 | Beun | 361/413 X |
| 4,457,570 | 7/1984 | Bogese, II | 339/17 C |
| 4,460,235 | 7/1984 | Gelin | 339/175 MP X |

Primary Examiner—R. R. Kucia
Attorney, Agent, or Firm—McCormick, Paulding & Huber

[57] ABSTRACT

The invention concerns a front plate mounting group for a printed circuit board with a carrier, having connector elements for connecting the carrier to the printed circuit board which connector elements are arranged in a first predetermined raster, as well as with housings for receiving functional parts, whose housing contacts are arranged according to a second predetermined raster and which are in releasable assembly with the connector elements. The carrier is formed as an adapter and the connector elements are L-shaped and in the adapter their legs, which are brought into engagement with the housing contacts, are engaged by the adapter to prop the other legs against the force imposed thereon during insertion into the printed circuit board, the housings being standardized in accordance with the second raster, and the connecting elements in the adapter being emplaced or not according to need, the adapter having plug openings corresponding to the second raster, which receive the legs of the connecting elements forming the contact connections with the housing contacts.

16 Claims, 16 Drawing Figures

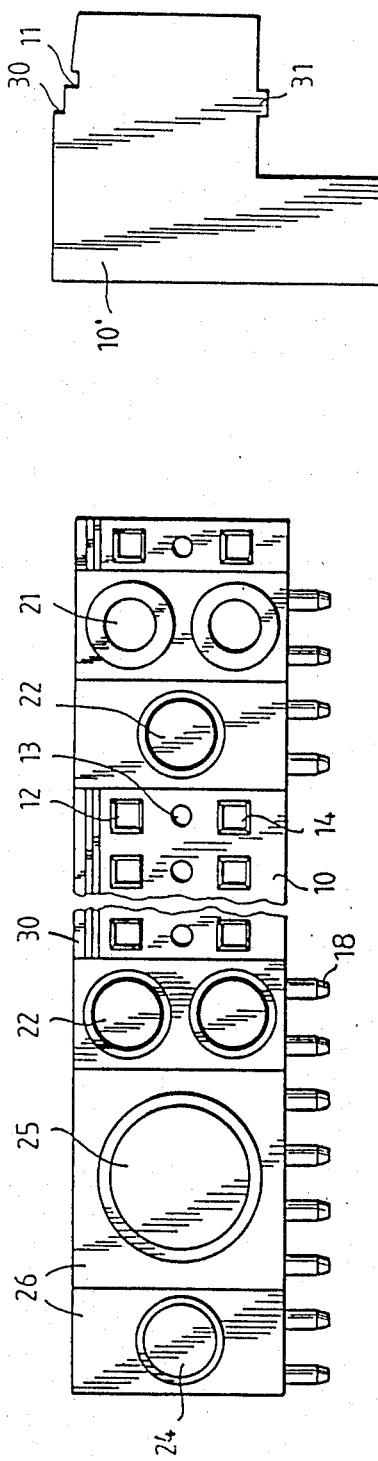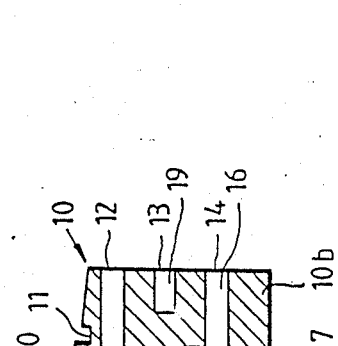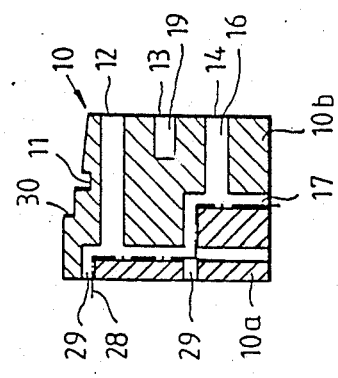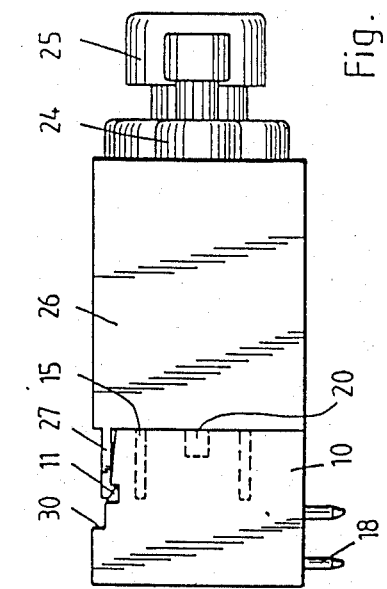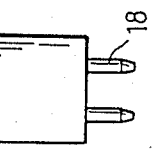

FRONT PLATE MOUNTING GROUP FOR A PRINTED CIRCUIT BOARD

The invention concerns a front plate mounting group for a printed circuit board, the group including a carrier having connector elements for connecting the carrier to the circuit board arranged in accordance with a first predetermined raster, and the group also including housings for receiving functional parts with housing contacts, arranged in accordance with a second predetermined raster, the housing contacts standing in releasable engagement with the connector elements through plug contact connections arranged in the second raster.

As used herein the term "raster" refers to the manner in which coengageable connecting parts, in a set of multiple connections, are arranged in the plane of the connections, and means that the parts are arranged in accordance with a grid system of lines the intersection points of which are the points at which connecting parts may be located. For example, where one component is a printed circuit board and another component to be connected to it is a functional module, the connecting parts of the circuit board may be holes in the circuit board arranged in accordance with a standardized raster defined by a first set of lines spaced 0.1" from one another and running transversely of the board and a second set of lines spaced 0.1" from one another and running longitudinally of the board with the intersections of the lines defining the locations of the holes (there not however necessarily being a hole at each such location), and the cooperating contact pins or prongs on the module are arranged in accordance with the same raster (there not necessarily being a prong at each possible prong location) so that when the module is moved into assembly with the circuit board the prongs will register with and move into holes of the circuit board.

One such known front plate mounting group has a connector element carrier a standardized plug strip in which the connector elements are arranged inside of the frame-like strip according to a predetermined raster, the connector elements protruding out of both the bottom side and the front side of the plug strip. Housings with functional components, such as indicators and operating elements, and having corresponding sockets for the front side connector element protrusions of the plug strip, can then be plugged in. In this case, the plug strip with the protruding contact elements is inserted in the printed circuit board and then soldered, the plug strip being provided with contact elements at all raster points, which is both expensive and requires a large space on the circuit board, especially if only a limited number of functional components are to be emplaced.

The object of the invention is to provide a front plate mounting group of the afore-named type, which can be equipped with the necessary connector elements in a simple way and can be easily connected with the printed circuit board.

This problem is solved in that the connector element carrier is formed as an adapter and in that the connector elements are of L-shape and are propped by the adapter against the force exerted on them by insertion into the printed circuit board, the housings being standardized according to the second raster and the connector elements being insertable in the adapter according to need, the adapter having plug openings arranged according to the second raster, which plug openings receive the contact connection forming legs of the connector elements.

One such group is especially well-adapted for behind the front components and allows both a prefabrication and a pretesting of the group before its mounting to a printed circuit board. The connector elements can as needed be inserted in a simple way from the rear side of the adapter and are so arranged and proposed that they are securely held and can be connected with the printed circuit board in a simple way. The housings for the functional components are located and secured relative to the adapter in the case where they are not made one piece with the adapter.

Further details of the invention are given by the dependent claims and the following description.

The invention is explained hereinafter in connection with the accompanying drawings representing embodiments of the invention. The drawings are:

FIG. 1 is a front view of one embodiment of a front plate mounting group.

FIG. 2 is a side view of the group of FIG. 1.

FIG. 3 is a cross-sectional view of the adapter of the group of FIG. 1.

FIG. 4 is a side view of an additional adapter for the group of FIG. 1.

DESCRIPTION OF THE PREFERRED EMBODIMENTS

Figure 5:
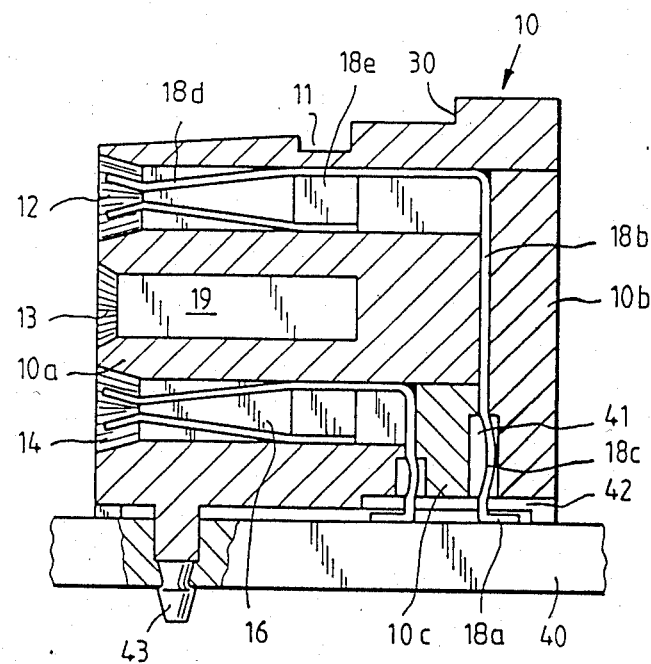
FIG. 5 is a cross-sectional view of a further embodiment of an adapter of a front plate mounting group.

The front plate mounting group of FIGS. 1–3 includes an adapter 10 of essentially rectangular shape having a groove 11 extending along its length on its upper side and spaced from its forward upper edge. The area from the groove 11 to the forward edge is inclined.

On its front side, the adapter 10 has a plurality of openings 12, 13, 14 lying in three superimposed parallel rows and arranged in a raster array with equal spacing in the longitudinal direction of the adapter 10. Moreover, the upper and lower openings 12 and 14 form sockets for receiving contact pins 15. Channels 16 extend inwardly from the openings 12 and 14 parallel to the bottom side of the adapter 10 and connect with channels 17 which terminate at the bottom side of the adapter 10 and run parallel to the front side of it. As needed, connector elements can be inserted in the channels 16, 17, which connector elements are of angular shape and whose contact springs (not illustrated) are received by the channels 16. The ends of the connector elements 18 extending from the adapter 10, whose raster arrangement corresponds to the raster arrangement of the insertion holes of the associated printed circuit board, can be fastened in such insertion holes by pressing them into the board, since they are backed up by the adapter in the opposite direction by the leg of the connector element received in the channel 16.

The openings 13 located between two superimposed openings 12, 14 are the mouths of blind openings 19 which serve to receive pins 20.

Functional components such as switch or test sockets 21, LED's 22, push buttons 24, 25, potentiometers or other such adjusting organs, counters, or the like are arranged in standardized housings 26 whose widths correspond to a multiple of the raster spacing of the openings 12, 13, 14 in the longitudinal direction and whose height corresponds to the height of the adapter 10, the housings being of equal depth.

A device is especially provided for locating the housing 26 with respect to the adapter 10 according to the raster of the openings 12, 14. For this purpose, the housing 26 can have on its rear side at least one pin 20 corresponding to the rastering of the openings 13 for insertion in such openings, the rear side of the housing also having the necessary number of contact pins 15 corresponding to the rastering of the openings 12, 14. Moreover, the housing 26 has on its rear side a spring tongue 27 extending perpendicular to its length, which tongue engages the groove 11 with its hook-shaped end to serve as a transport safety catch for the housing 26. The inclination between the forward upper edge and the groove 11 of the adapter 10 serves when assembling the housing 26 to the adapter 10 to deflect the spring tongue 27 until its hook-shaped edge can move into the groove 11.

In place of the spring tongue 27 and perhaps the pin 20, other releasable connectors can be used to fasten and register the housing 26 on the front side of the adapter 10, yet the illustrated implementation is preferred for injection molding reasons.

To allow the adapter 10 to also perhaps be applied to a printed circuit board with its front side directed upwardly, the channels 17 are extended above the channels 16 and connected with channels 29, which channels 29 terminate at the rear side of the adapter 10 and are arranged in the raster of the channels 17 or of the receiving holes of the printed circuit board. Because of the lengthening of the channels 17, contact pins which extend out of the channels 29 abut the adapter 10 and therefore can be fastened to the printed board by pressing techniques. The adapter 10 can extend over the entire width of a front plate which is especially advantageous if housings with functional components are to be placed over the entire width of nearly the entire width of the front plate. It can, however, also be practical for the adapter 10 to have a width corresponding to only one or two housings—with four contact pins; the front plate width can then, in accordance with need, be filled with such individual adapters in adjacent rows or with blind pieces where no housings with functional components are provided.

The adapter 10 of the embodiment of FIGS. 1-3 consists preferably of two parts 10a, 10b, which are connected to one another by ultrasonic welding, gluing, or releasable or non-releasable pin connectors after the insertion of the connector elements 18. The separation line 28 between the two parts 10a, 10b is illustrated by broken lines in FIG. 3 and runs along the channels 17 and 29.

The channels 17 can also be connected with one another by non-illustrated channels extending the length of the adapter 10 to allow the adapter 10 to be prefabricated with contact connections. Such contact connections are convenient where it is known in advance what functional components are contained in the housings to be attached to the adapter. If, for example, a seven-segment display is involved, the associated decoding logic can be accomodated in the adapter so as to save space on the printed circuit board. This is only an example of different standard or special networks which effect an adaptation of the circuits on the printed circuit board on one hand to the functional components on the other hand.

The adapter 10 can be enlarged by a further adapter 10' for which purpose the adapter 10 has a step 30 on its upper side extending in the longitudinal direction and arranged to neighbor the groove 11. The adapter 10' is essentially L-shaped and engages the adapter 10 along its upper and rear sides. On the arm of the adapter 10' engaging the upper side of the adapter 10 is, on its underside, a rib 31 which, upon pushing of the adapter 10' onto the adapter 10, moves into the step 30 and serves to support the adapter 10'. Otherwise, the adapter 10' is made with the same raster as the adapter 10 so that it can likewise receive housings 26. If need be, housings 26 of double height can then be used which have their contact pins 15 plugged into both adapters 10 and 10'. The adapter 10' can likewise have a step 30 in its upper side for securing a further adapter, superimposed on the adapter 10', which is made analogously to the adapter 10', and so forth. In this way, housing 26 of similar depth can be attached to the adapters 10, 10', the rear sides of which housings are aligned while their upper and lower sides are aligned with the upper and lower sides of the adapter 10, or the upper and lower sides of the leg of the adapter 10' superimposed on the adapter 10 or with the upper and lower sides of the adapter 10 and 10'.

Figure 6:
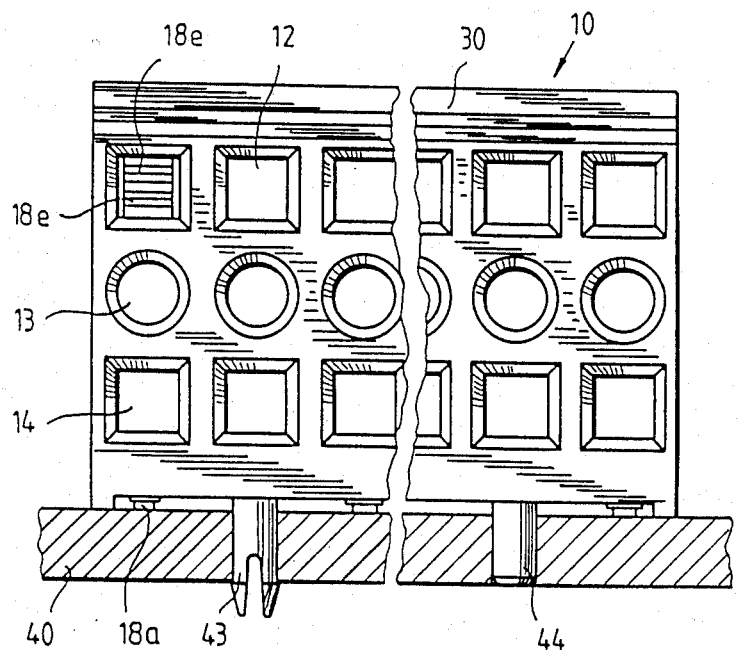
FIG. 6 is a front view of the adapter of FIG. 5.

The adapter 10 illustrated in FIGS. 5 and 6 differs from that of the foregoing embodiment in that the connector elements 18 are such as to be suited to upper surface mounting to a printed circuit board 40. For this purpose, the ends of the connector elements 18 projecting from the adapter 10 are provided with feet 18a so that a connection can be made by SMD technology. That means that the feet 18a are adhered to the printed circuit board 50 and subsequently are soldered by the effect of a hot air stream, the feet 18a carrying and having applied to them in advance the required solder material. Instead of this, however, a conductive gluing or the like can also be used.

Figure 7:
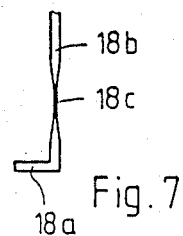
FIG. 7 shows an alternative construction for a connector element for the adapter of FIG. 5.

The connector element 18 is preferably elastic as to the leg 18b carrying the foot 18a so that a secure pressing of the foot onto the printed circuit board 40 is possible. For this purpose, for example, neighboring the foot 18a an elastic section 18c in the form of a bow or bend (FIG. 5) or in the form of a reduction of the strength of the connection contact material (FIG. 7) is provided. The elastic or springy section 18c is preferably arranged in a recess 41 neighboring the foot 18a which recess is wide enough to receive the elastic deformation of the leg 18b.

To allow for the delivery of a hot air stream to solder the feet 18a to the printed circuit board 40, a delivery channel 42 is conveniently provided on the underside of the adapter 10 in the vicinity of the feet 18a, which channel extends over substantially the whole width of the adapter 10.

To assure an even and constant spring pressure of the feet 18a on the printed circuit board 40 during soldering, the underside of the adapter 10 can be provided with snap feet 43 which are slotted and are insertable through corresponding holes in the printed circuit 40 so that their free ends expand and lock the adapter 10 to the circuit board 40 through their snap effect. Additionally, pins 44 can be provided for positioning the adapter 10 on the printed circuit board 40.

As in the previously described embodiment, the connector elements 18 in the openings 16 have spring tongues 18d which are connected in pairs through a connecting piece 18e.

The adapter 10 according to FIGS. 5 and 6 preferably consists of three parts 10a, 10b, and 10c with the separation line running at least in part along the channels which receive the connector elements 18. In this case also, additional adapters 10' can be used for expansion and channels terminating on the rear side of the adapter 10 can be provided for receiving the connector elements 18 so that the adapter 10 can also be fastened to the printed circuit board by means of its rear side. Prefabricated contact connections can also be provided in the adapter 10 as previously explained.

Figure 8:
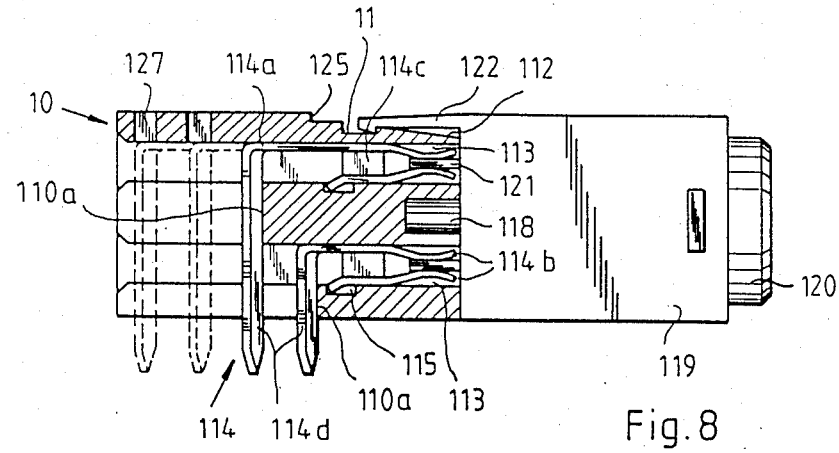
FIG. 8 is a side view of another front plate mounting group embodying the invention with the adapter being shown in vertical section.
Figure 9:
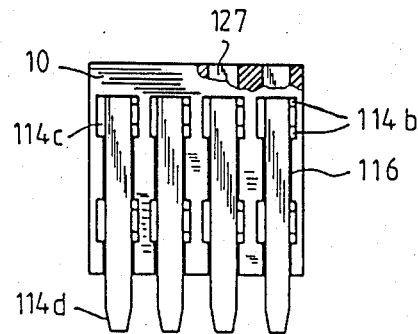
FIG. 9 is a rear view of the adapter of FIG. 8.
Figure 10:
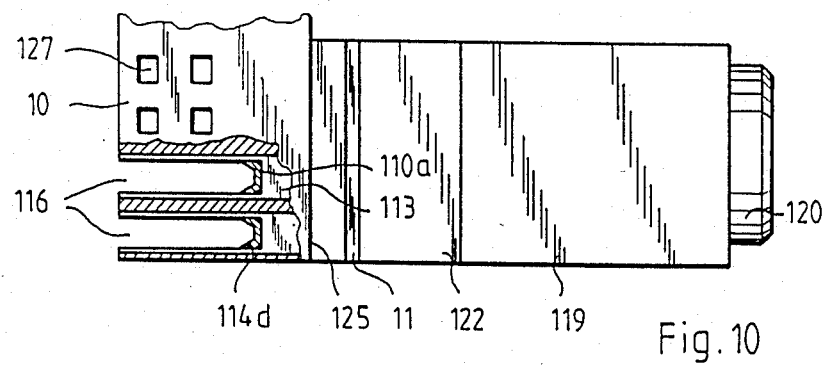
FIG. 10 is a plan view of the mounting group of FIG. 8 with the adapter being partially shown in section.

The front plate mounting group of FIGS. 8-10 includes an adapter 10 of generally rectangular shape and on whose upper side is a groove 11 extending over the length of the adapter, which groove is spaced from the forward upper edge. The area 112 from the groove 11 to the neighboring forward edge is inclined. The adapter 10 has a plurality of plug openings 113 with mouths on the front side of the adapter which are arranged in two superimposed parallel rows in a predetermined raster arrangement, each of which plug openings can receive one leg 114a of an L-shaped connector element 114 with the leg 114a being formed as a part of a plug connector. For this purpose, the leg 114a has associated with it a contact spring 114b, the two of which are connected to one another through a bridge piece 114c, with the contact spring 114b having its rear outwardly bent free end received in a recess 115, which recess communicates with the associated plug opening 113, so that the contact spring is propped against a rearward movement. Insertion slots 116 for the connector elements 114 extend inwardly from the rear side of the adapter 10 and from its bottom side upwardly to the plug openings 113 with which they communicate. As is seen in FIG. 8, the connector elements 114 can be inserted as needed into the slots 116 from the rear side of the adapter 10 and can be moved forwardly until their legs 114d, which are perpendicular to the legs 114a and which extend to a printed circuit board, abut against stop shoulders 110a defining the inward limits of the slots 116. The slots 116 are, as seen in FIG. 8, stepped, so that the legs 114d of the lower row of connector elements 114 are arranged in a predetermined raster arrangement with respect to the legs 114d of the upper row of contact members 114. The ends of the connector elements 114, which extend out of the adapter 10, and whose raster arrangement corresponds to the raster arrangement of the receiving openings of the printed circuit board 117, can be fastened in the corresponding openings of such a printed circuit board by pressing them into the board, since they are propped in a direction opposite the insertion direction by the legs 114a engaging the adapter 10 in their associated plug openings 113.

Between two plug openings 113 located above one another, the adapter 10 has on its front side a blind opening for receiving a pin 118 located on the rear side of a housing 119. The housing 119, whose depth is preferably unitized and whose height is equal to the height of the adapter or a multiple thereof, has a width at least two times the raster spacing of the plug openings. The housings contain functional components, for example, circuit or test jacks, LED's, push buttons, potentiometers or other adjusting members, counters or the like. The housings 119 are preferably standardized in the way they are made. On their rear sides, the housings 119 include pins 118 corresponding to the raster arrangement of the openings 113 as well as also including the required number of contact pins 121 corresponding to the raster arrangement of the plug openings 113, so that the housing 119 is insertable by means of its pins 121 into a contact forming connection with the legs 114a of the connector elements 114, the pin 118 at the same time being inserted into the corresponding blind opening of the adapter 10 to properly locate the housing 119.

Moreover, the housings 119 have on their rear sides a spring tongue 122 extending over their lengths, which engages the groove 11 with its hook-shaped end to serve as a transport security means for the housing 119. The slope 122 between the front upper edge of the adapter 10 and the groove 11 serves in the assembly of the housing 119 to the adapter 10 to deflect the spring tongue 122 until its hook-shaped end moves into the groove 11.

The plug openings 113 in the illustrated embodiment are generally of square shape and are somewhat wider than the width of the slots 116 so that the leg 114a is essentially supported on all sides while the leg 114d is laterally supported by the walls defining the slot 116 of the adapter 10 as well as by the corresponding abutment shoulder 110a.

Figure 11:
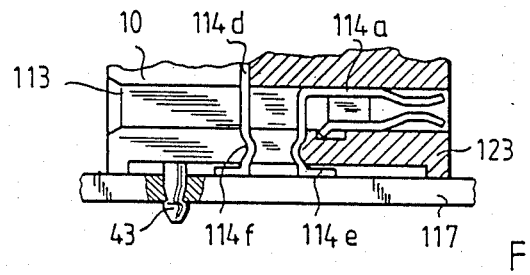
FIG. 11 is a fragmentary sectional view taken through an adapter comprising another embodiment of the invention.

According to FIG. 11, connector elements 114 are provided to suit the adapter to mounting to the upper surface of the printed circuit board 117. For this purpose, the connector elements 114 have feet 114e on legs 114d which extend to the printed circuit board 117 with an elastic section 114f further preferably being provided near the foot 114e, which elastic section can take the form of either a bow or bend or a diminishment of the strength of the leg. Such connector elements 114 lend themselves to connection with the printed circuit board 117 by SMD technology, wherein the feet 114e are adhered to the printed circuit board 117 and subsequently soldered through the effect of a hot air stream, the feet 114 carrying solder material applied to them in advance of their assembly with the printed circuit board. Instead of this, conductive gluing or the like can also be used.

For delivering a hot air stream to solder the feet 114e to the printed circuit board 117, hot air channels are preferably additionally provided, which channels extend over the entire length of the adapter on its lower side and at the front and rear sides are limited by a foot strip 123 of the adapter 10.

To obtain a constant and uniform spring pressure of the feet 114e onto the printed circuit board 117 during the soldering, the lower side of the adapter can also be provided with snap feet 43. Additionally, pins for positioning the adapter 10 on the printed circuit board 117 can also be provided.

The adapters 10 are preferably made so as to be stackable on top of one another and for this purpose are provided on their upper sides with a shoulder 125 extending in the longitudinal direction of the adapter and onto which a corresponding shoulder 126 of a superimposed adapter 10 abuts. The adapters 10 are of such depth that through openings 127 can be provided on the upper side of the adapter 10 in a raster arrangement corresponding to that of the legs 114d of the connector elements 114. The connector elements 114 of an adapter 10' stacked over an adapter 10 are plugged with their legs 114d through the openings 127 and extend to the printed circuit board 117, the through openings 127 serving at the same time to support on all sides the relatively long legs 114d. In any event, one is provided here with two additional rows of through openings. In the case of an arrangement of the adapters 10, 10' in three levels, the two upper levels each use only one row of through openings for their connections (see FIG. 13) while in the case of two stacked adapters a two-rowed connection is possible for each level (see FIG. 12).

Figure 12:
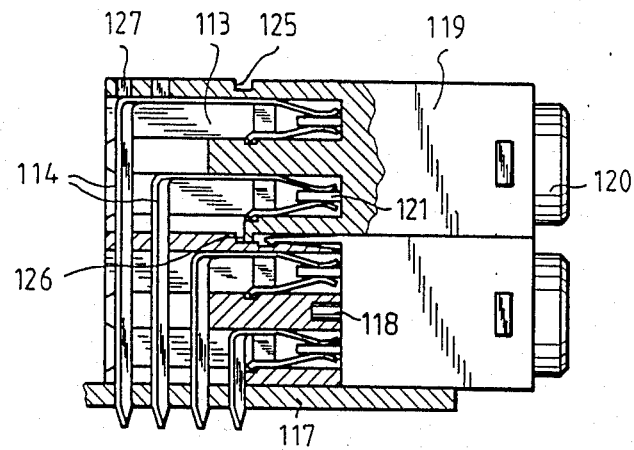
FIGS. 12 and 13 show two embodiments of a mounting group with elements stacked over one another.
Figure 13:
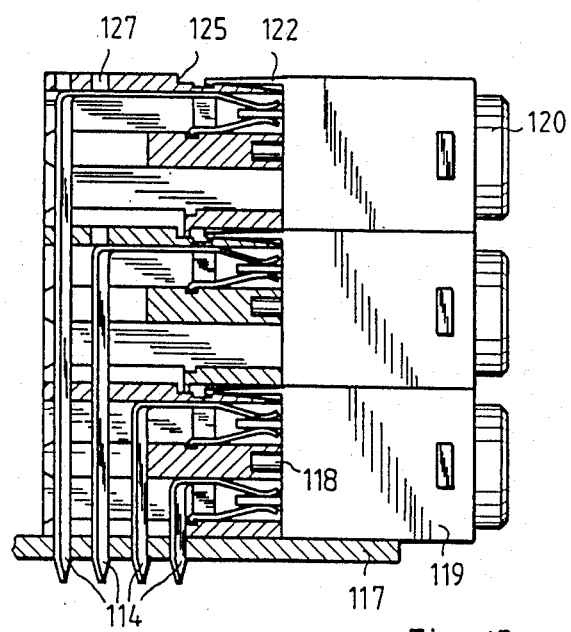

As seen in FIG. 12, the adapter 10 or 10' can also be made of one piece with the housing 119, in which case the shoulder 125 is formed by one side wall of a grovoe. Adapters 10 with integral housings 119 as well as adapters 10 with plugged-in housings can be used alongside of and on top of one another. (The same is also possible with the embodiments of FIGS. 1–7).

The lengthening of the adapters 10 to accomodate the through openings 127 further makes possible an arrangement of the connector elements 114 such as shown by broken lines in FIG. 8.

Instead of providing through openings 127 corresponding to the raster of the legs 114d, L-shaped adapters can also be used which engage the upper and rear sides of the adapter 10 as in the embodiment of FIG. 4 and which otherwise are formed like the adapter 10. This arrangement can also be used in several levels.

Figure 14:
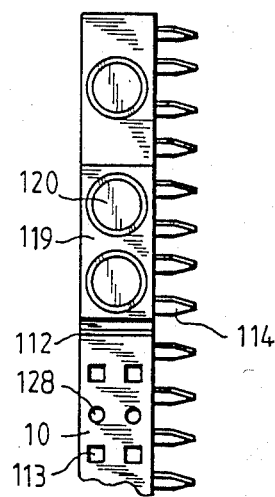
FIG. 14 is a front view of an especially flat mounting group.
Figure 15:
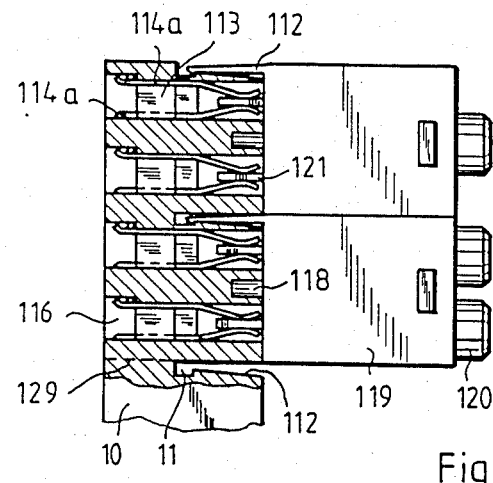
FIG. 15 is a plan view of the mounting group of FIG. 14 with part of the view being shown in section.
Figure 16:
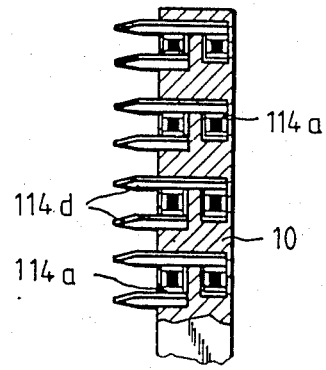
FIG. 16 is a rear view of the mounting group of FIG. 14 with part of the figure being shown in section.

The embodiment illustrated in FIGS. 14 to 16 concerns an adapter 10 for flat constructions in which, unlike the case of the previous embodiments, on the front side two parallel rows of plug openings 113 are provided and parallel to them one row of locating holes are provided, which are arranged in the same spacing as the plug openings with the middle points of the holes of the three vertical rows being spaced equidistant from one another, but with two parallel rows of equidistant plug openings 113 being provided, so that each two pairs of plug openings 113 has associated with it one pair of locating openings 128 for a pin 118.

The height of the adapter 10 is such that the same housing are used as with the previous embodiments, but are rotated through 90° for which purpose the adapter has associated slots which terminate in grooves 11 and have associated slopes 112 which extend inwardly from the front side of the adapter 10. These slots and grooves receive the spring tongues 122. On the bottom side of the adapter 10, the connector elements 114 are arranged in only one row with the insertion slots 116 being so widened relative to the plug openings 113 that the legs 114d of the connector elements 114 of the upper row of the raster are spaced from the legs 114d of the contact elements 114 of the lower row. Such adapters can be made in correspondence with that of FIGS. 1–7 or can be made of one piece with the housing 26 or 119.

The adapter can be provided with lines of weakening 129, as for example illustrated by broken lines in FIG. 15, to allow it to be separated according to need to the desired length.

While the depth of the housings 26, 119 is preferably unitary, their height is equal to that of the adapter 10 or to a multiple thereof with the width of the housings 26, 119 being at least twice the raster spacing of the plug connectors.

We claim:

1. A front plate mounting group for use with a printed circuit board having connecting parts arranged in accordance with a first predetermined raster, said mounting group comprising an adapter for connection with said circuit board and a plurality of housings of standardized size and shape for releasable connection with said adapter and containing functional components, each of said housings having male prong-type housing contacts arranged according to a second predetermined raster, said adapter including a body with first and second faces and also including a plurality of connecting elements received by said body, said connecting elements of said adapter having first legs located adjacent said one face of said adapter body and arranged in accordance with said first predetermined raster for connecting cooperation with said connecting parts of said printed circuit board and having second ends provided with female contact elements located adjacent said second face of said adapter body and arranged in said second predetermined raster for releasable connecting engagement with said prong-type housing contacts of said housings, each of said connecting elements consisting in part of a first substantially straight leg extending from said first end of said connecting element to a point spaced from said first end and each of said connecting elements being squarely bent by substantially ninety degrees at said point so as to define a connecting element propping portion extending perpendicular to and adjacent said first leg, said body of said adapter having means defining for each of said connecting elements a propping surface engageable with said propping portion of said element to prop said first leg of said connecting element against movement relative to said adapter body under the force imposed on said first end of said connecting element as said adapter is moved relative to said printed circuit board so as to bring said first ends of said adapter connecting elements into connection with said connecting parts of said printed circuit board, said adapter body having a plurality of plug openings extending inwardly from said second face and arranged in said second raster for slidably receiving said second ends of said connecting elements, and said connecting elements and said adapter body being otherwise so formed that said connecting elements are insertable in said adapter body according to need.

2. A front plate mounting group as defined in claim 1 further characterized by said propping surface extending perpendicular to said first leg of the element in the direction of said propping portion of said element, facing said first end of the element, and extending in the direction of said propping portion of said element to either side of said first leg.

3. A front plate mounting group as defined in claim 1 further characterized by each of said connecting elements of said adapter being L-shaped so as to have two legs one of which is said first leg and the other of which legs includes said propping portion of said connecting element and also includes one of said second ends.

4. A front plate mounting group as defined in claim 3 further characterized by said first and second faces of said adapter body being perpendicular to one another, said first face being a bottom face and said second face being a front face and said adapter body also including a rear side spaced from and generally parallel to said front face, said adapter body having said plug openings extending perpendicular to said front face of said body for slidably receiving said second legs of said connecting elements, and said body further having insertion slots extending inwardly from said rear side of said adapter body and upwardly from said bottom face to respective ones of said plug openings for receiving said first legs of said connecting elements so that said connecting elements can be inserted into said adapter body according to need.

5. A mounting group according to claim 4 further characterized in that said insertion slots are limited inwardly of said adapter body in the direction toward said second face by abutment shoulders on said adapter body which form stops for said first legs of said connecting elements.

6. A mounting group according to claim 1 further characterized in that said adapter body has L-shaped channels for receiving said connecting elements with part of each of said L-shaped channels being one of said plug openings.

7. A mounting group according to claim 6 further characterized in that said adapter body is made of at least two parts with the separation line between said two parts running along those portions of said channels for receiving said first legs of said connecting elements.

8. A mounting group according to claim 6 further characterized in that said first and second faces are perpendicular to one another, said first face being a bottom face and said second face being a front face and said adapter body also including a rear side spaced from and generally parallel to said first face, and in that said channels in said adapter body are extended to an L-shape by means of other channels which terminate at said rear side of said adapter body and are arranged in said first predetermined raster.

9. A mounting group according to claim 1 further characterized in that at least one of said housings is made of one piece with said adapter body.

10. A mounting group according to claim 1 further characterized in that said adapter body has a third face generally perpendicular to said second face, and in that each of said housings is fixable to said adapter body by means of a releasable catch connection consisting of a spring tongue arranged on the housing and extending generally in the direction of said housing contacts and of a groove in said third face of said adapter body which is catchingly engageable with said spring tongue, said groove extending parallel to said second face.

11. A mounting group according to claim 1 further characterized in that coengaging mechanical parts are provided on each of said housings and on said adapter body for locating each housing with respect to said adapter body, said coengaging mechanical parts being arranged in accordance with said second raster.

12. A mounting group according to claim 4 further characterized in that said adapter body also includes an upper face parallel to said bottom face and has openings extending from said upper face to said insertion slots to receive the first legs of another adapter which may be stacked on top of said adapter body and arranged in accordance with said first raster.

13. A mounting group according to claim 4 further characterized by a second adapter adapted to be arranged in assembly with said first adapter on said circuit board, said second adapter having an L-shaped body with an upper portion adapted to overlie said first adapter body and a rear portion adapted to be positioned behind said first adapter body when said second adapter is assembled with said first adapter, said second adapter including connecting elements having first ends arranged in accordance with said first predetermined raster for connecting cooperation with said connecting parts of said circuit board and having second ends arranged in said second raster for cooperation with said housing contacts of said housings.

14. A mounting group according to claim 12 further characterized in that said first adapter body has a step on its upper side engageable by a shoulder on said body of said second adapter when said second adapter is assembled with said first adapter.

15. A mounting group according to claim 1 further characterized in that said adapter body has lines of weakening extending transversely to its longitudinal direction allowing said adapter body to be broken off to a length suiting the number of said housings to be attached to it.

16. A mounting group according to claim 1 further characterized in that said connecting elements have feet for mounting to the top surface of said printed circuit board, and in that said adapter body near said feet has a hot air delivery channel extending over practically the entire width of said adapter body.

* * * * *